United States Patent [19]
Lohninger et al.

[11] Patent Number: 5,497,163
[45] Date of Patent: Mar. 5, 1996

[54] DOPPLER RADAR MODULE USING MICRO-STRIPLINE TECHNOLOGY

[75] Inventors: Gerhard Lohninger, Munich; Walter Zimmermann, Dorfen, both of Germany

[73] Assignee: Siemens Aktiengesellschaft, Munich, Germany

[21] Appl. No.: 285,737

[22] Filed: Aug. 4, 1994

[30] Foreign Application Priority Data

Aug. 9, 1993 [EP] European Pat. Off. ............... 93112716

[51] Int. Cl.⁶ .................................................... G01S 7/03
[52] U.S. Cl. .............................. 342/175; 342/28; 455/327
[58] Field of Search ................................. 342/28, 20, 175; 455/327

[56] References Cited

U.S. PATENT DOCUMENTS

| | | | |
|---|---|---|---|
| 4,369,518 | 1/1983 | Olson | 455/3 |
| 4,731,611 | 3/1988 | Muller | 342/28 |
| 4,931,799 | 6/1990 | Wen | 342/110 |
| 4,967,201 | 10/1990 | Rich | 342/175 |
| 5,023,624 | 6/1991 | Heckaman | 343/860 |
| 5,262,783 | 11/1993 | Philpott et al. | 342/28 |

FOREIGN PATENT DOCUMENTS

| | | |
|---|---|---|
| 0129251 | 12/1984 | European Pat. Off. . |
| 2575554 | 7/1986 | France . |
| 4013049 | 10/1990 | Germany . |
| 2010036 | 6/1979 | United Kingdom . |
| 8303309 | 9/1983 | WIPO . |

OTHER PUBLICATIONS

Japanese Abstract, I. Masayuki et al., "Transceiver Using Microwave Integrated Circuit", JP59219001, vol. 9, No. 89 (E–309) Dec. 10, 1984.

*Primary Examiner*—Ian J. Lobo
*Attorney, Agent, or Firm*—Hill, Steadman & Simpson

[57] ABSTRACT

A Doppler radar module constructed using micro-stripline technology is used in motion sensors and includes a local oscillator stabilized with a dielectric resonator that feeds a microwave antenna via a mixer that is connected in series. The transmission signal is emitted from the microwave antenna and is reflected back from an object where it is received by the antenna and forwarded to the mixer. The mixer mixes the reflected signal with a portion of the oscillator signal to form a Doppler signal.

12 Claims, 4 Drawing Sheets

DOPPLER RADAR MODULE USING MICRO-STRIPLINE TECHNOLOGY

BACKGROUND OF THE INVENTION

1. Field of the Invention

The present invention is related generally to a Doppler radar module using micro-stripline technology enclosed within a housing of electrically conductive material.

2. Description of the Related Art

A stripline Doppler radar is disclosed in European published application 0 129 251, which includes a high-frequency oscillator coupled by a high-frequency connection to a second stripline via a first stripline and a dielectric resonator. The second stripline is connected to an antenna. The resonator is arranged between the two stripline conductors so that the antenna and a reception diode have a prescribed power supplied to them. The Doppler radar apparatus operates at frequencies of approximately 10 GHz and is equipped with a Gunn element, a Schottky-beam lead-diode and with a ceramic microwave motherboard. The known device is disadvantageous in that it is complicated to assemble, has a high DC power consumption, has high local oscillator noise emissions, emits harmonics, and has a packing density that is too low for mass production. Furthermore, special precautions must be taken has protective measures against electrostatic discharge (ESD).

SUMMARY OF THE INVENTION

An object of the present invention is to provide a Doppler radar module that has a high sensitivity and relatively low emission of harmonics while at the same time has a high resistance to electrostatic charges. In addition, the Doppler radar module of the present invention is of a compact structure which provides cost benefits and permits mass production.

These and other objects and advantages of the invention are achieved in a Doppler radar module using stripline technology that includes a local oscillator stabilized with a dielectric resonator which is connected in series via a mixer to feed signals to a microwave antenna so that transmission signals are emitted from the microwave antenna. Moving objects reflect the signals back so that they are received by the microwave antenna and are supplied therefrom to the mixer where they are mixed with a portion of the oscillator signal in a mixing process to form a Doppler signal.

Advantageous developments and improvements of the invention are achieved when the mixer is connected in series between the oscillator and the antenna and includes one diode and a mismatch circuit connected to the local oscillator and further includes an antenna matching circuit connected to the microwave antenna. The mixer also includes another diode connected with a micro-stripline to ground for noise suppression.

According to a preferred embodiment of the invention, a multi-layer motherboard is mounted to divide the housing into two chambers with the local oscillator and transistor arranged in one of the two chambers and the mixer and the antenna feed arranged in the other of the two chambers on the other side of the multi-layer motherboard. The micro-stripline Doppler radar module preferably includes a quarter wave ($\lambda/4$) stripline leading to ground at the antenna side and a protective resistor connected to the output side of the mixer. The multi-layer motherboard is composed of two motherboards which are copper laminated at both sides and are etched free of the copper layer in a predetermined way and which are joined at the back sides thereof. The back sides of the two motherboards may be joined with glue.

The local oscillator of the present Doppler radar module includes an active element which may either be a field effect transistor or a bi-polar high frequency transistor.

In an embodiment having a multi-layer motherboard, the radar module includes the striplines of the local oscillator, a dielectric resonator, the field effect transistor, the active element of the local oscillator, a gate DC resistor, and a RF series resistor on one side of the multi-layer motherboard; while a surface wave filter structure, a voltage supply drop resistor, the mixer and the antenna matching circuit are arranged at the other side of the multi-layer motherboard. The oscillator signal generated by the local oscillator is supplied from one side of the multi-layer motherboard to the other side through a via, or through connection. Preferably, the circumference of the multi-layer motherboard is provided with a plurality of through connections for connecting the two middle copper layers of the multi-layer motherboard to the housing, as well as for sealing the two chambers and avoiding radio frequency emissions at the edges of the motherboard. The through connections of the multi-layer motherboard are provided at the circumference of a panel and the though connections form segments in the form of edge perforations after punching of the motherboard. Preferably, a low frequency motherboard is directly soldered to the housing. A patch antenna proves to be advantageous for use as the microwave antenna of the present invention.

In the Doppler radar module of the present invention, a local oscillator which may be, for example, a field effect transistor oscillator is stabilized with a dielectric resonator and is connected through a mixer element in series to a microwave antenna which is preferably a patch antenna. The microwave antenna emits the oscillator signal as a transmission signal with a transmission power level Ps. When the microwave signal is reflected back by a moving object it is received by the same microwave antenna with a reflection power level Pe and is supplied to the mixer where it is mixed with a part of the local oscillator signal during a mixing function to form a Doppler signal. Due to the serial arrangement of the local oscillator, the mixer element, and the antenna, the present invention achieves a high mixing efficiency and a high sensitivity while simultaneously minimizing the transmission power that needs to be beamed out of the module to effectively sense movement.

The construction of the Doppler radar module using a multi-layer motherboard permits the housing of the module to be divided into two chambers, wherein a local oscillator is arranged at one side of the motherboard in one chamber and the mixer with the antenna feed is arranged at the other side in the other chamber. Not only does this provide a compact structure but harmonic emissions are also minimized.

ESD (electro static discharge) resistance is achieved in the present module by providing a quarter wave-length ($\lambda/4$) line leading to ground at the antenna side of the mixer and providing a protective resistor at the output side of the mixer.

BRIEF DESCRIPTION OF THE DRAWINGS

The present invention shall be set forth in greater detail below with reference to exemplary embodiments shown in the drawing figures.

DETAILED DESCRIPTION OF THE PREFERRED EMBODIMENTS

Figure 1:
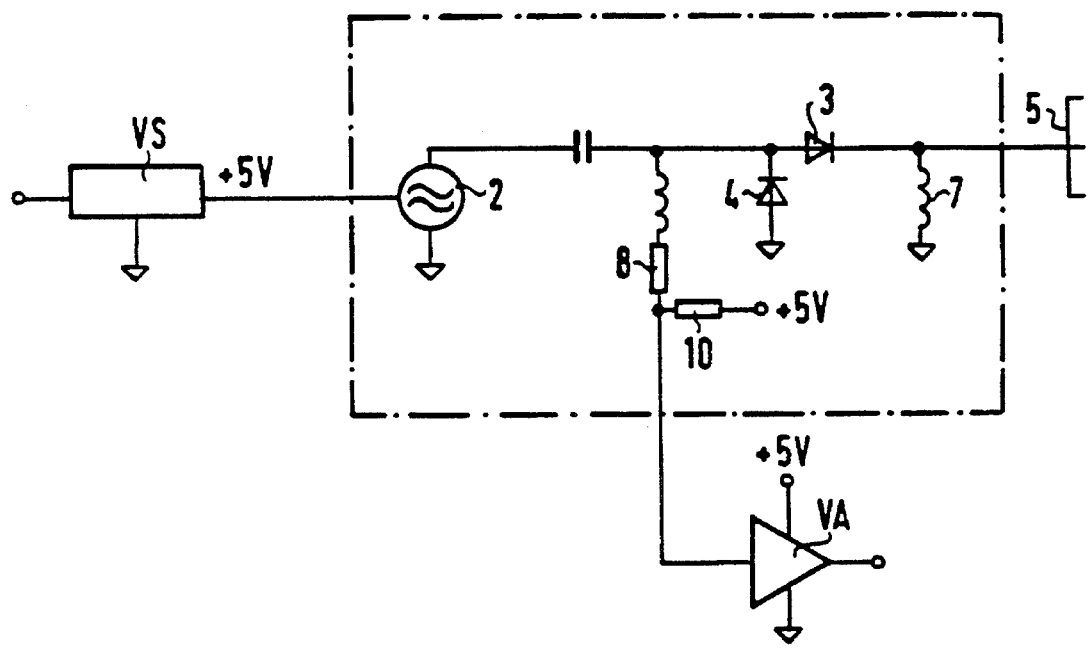
FIG. 1 is a schematic circuit diagram of a Doppler radar module according to the principles of the present invention.

In FIG. 1 is shown the circuitry of a Doppler radar module which may be used, for example, as a motion sensor. The Doppler radar module essentially includes three functional units, namely, the actual Doppler module, as shown enclosed in the broken line block, a low frequency (LF) pre-amplifier VA, and a voltage stabilizer VS. The actual Doppler module includes a local oscillator 2 which is in this example is FET (field effect transistor) oscillator which is stabilized by a dielectric resonator that feeds an oscillator signal to a microwave antenna 5, which is preferably a patch antenna, through a mixer that is connected in series therewith. The mixer includes mixer diodes 3 and 4 as shown in FIG. 1. The oscillator signal is transmitted out of the antenna 5 as a transmission signal.

The mixer includes at an antenna side a quarter wavelength ($\lambda/4$) stripline 7 that is connected to ground. At the output side of the mixer is provided a protective resistor 8 and a diode pull-up resistor 10 connected to the mixer diodes 3 and 4. The microwave signal that is emitted from the antenna is reflected by objects in motion and is picked up by the antenna if in the sensitivity range of the sensor and is supplied to the mixer diodes 3 and 4 so that a Doppler signal is generated. The Doppler signal is supplied to a low noise LF (low frequency) pre-amplifier VA for processing. The pre-amplifier VA together with the voltage stabilization unit VS forms the two components of the radio frequency system that are integrated on one side of the printed circuit board.

Figure 2:
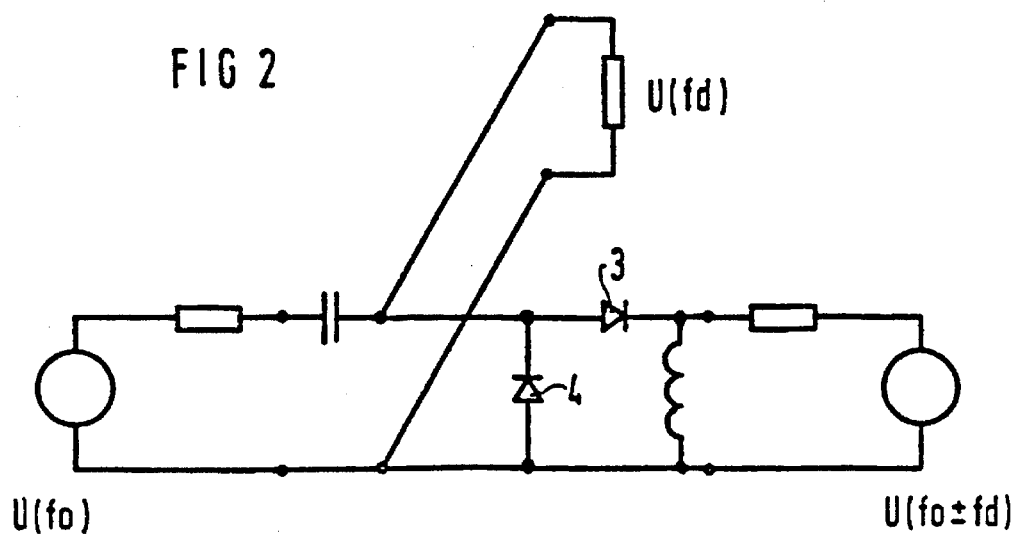
FIG. 2 is a simplified circuit diagram of the mixer utilized in the present Doppler radar module illustrating the mixer operation.

FIG. 2 shows a schematic diagram illustrating the use of a mixer connected in series in a Doppler radar system, the mixer here including, for example, Schokky diodes 3 and 4. The local oscillator signal (LO) is at a signal fo and is represented by a signal source U(fo). The signal received by the antenna is at possible frequencies of fo±fd which is represented by the signal source U(fo±fd). The Doppler signal which is generated in the Doppler radar module is at the Doppler frequency fd and is represented by the element U(fd). In operation, the local oscillator signal at the frequency fo is emitted from the microwave antenna and, when an object located in the sensitivity range of the sensor moves, the object reflects the microwave emission at a frequency shift. The reflected wave is picked up by the microwave antenna and is in turned supplied to the mixer. The mixing function involves mixing of the local oscillator signal at the frequency fo with the frequency offset wave at frequency fo±fd to supply the velocity proportional Doppler signal at frequency fd.

Figure 3:
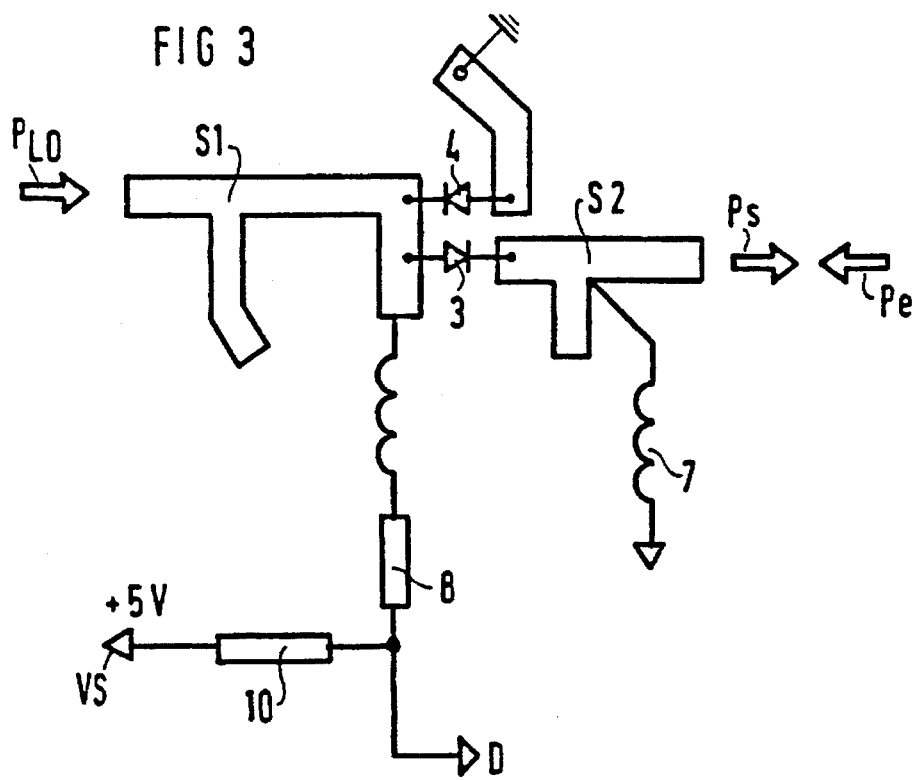
FIG. 3 is a diagram of an embodiment of the present mixer.

The mixer of the present invention as shown in more detail in FIG. 3 and includes two low barrier silicon diodes 3 and 4. The first diode 3 is connected in the series arm to the antenna as represented by the arrows Ps and Pe. The second diode 4 is connected to a micro-stripline S3 connected to ground which serves to perform a noise suppression function. A matching network stripline S1 is provided at the local oscillator (LO) side of the mixer and offers the first diode 3 a low impedance termination. The local oscillator is represented in FIG. 3 by the arrow $P_{Lo}$. The matching network stripline S1 performs two functions; first, the output power Ps is reduced to such an extent that the transmission power of the antenna 5 (as shown in FIG. 1) is lowered to a low value of, for example, 0 dBm EIRP due to the mismatch of the local oscillator 2 (as shown in FIG. 1) but the mixing function is fully maintained. Secondly, as optimum mixer termination at t-he local oscillator side is achieved for the reception signal Pe. A network stripline S2 is provided at the antenna side to serve for reception matching.

Figure 4:
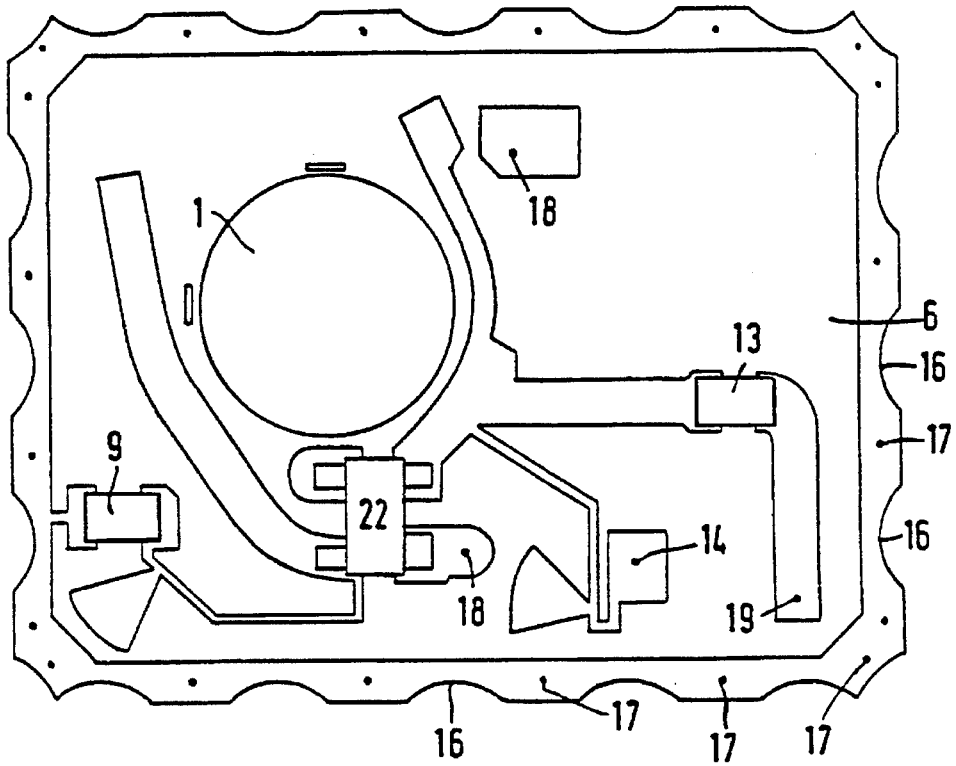
FIG. 4 is a plan view of one side of a multi-layer motherboard on which are mounted circuit parts for the Doppler radar module of the present invention.
Figure 7:
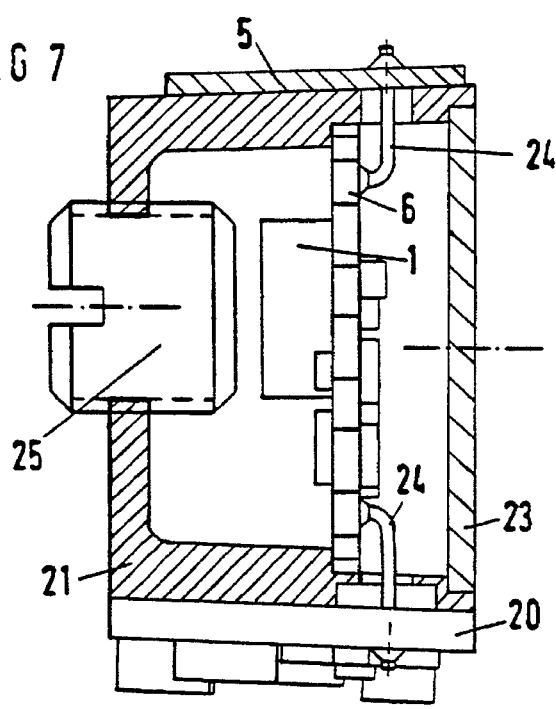
FIG. 7 is a cross-section through the Doppler radar module of FIG. 6 with the cover in place.

The antenna 5 as shown in FIG. 1 is preferably a space saving antenna which may be in the form of a patch antenna of Teflon material. The connection of the mixers structure of the diodes 3 and 4 and of the antenna matching network S2 to a multi-layer motherboard 6 (as shown in FIG. 4) onto which the components are mounted is achieved with a miniature lead of silver wire. This eliminates the need for a radio frequency duct component. Additionally, the microwave antenna 5 which is used is connected to a housing for the present Doppler radar module (as shown in FIG. 7) by a quarter wave ($\lambda/4$) stripline 7 on the multi-layer motherboard 6 at has its end provided with a short circuit. As a result, the ESD (electro static discharge) hazard from touching the patch microwave antenna 5 is avoided. A protective resistor 8, which is in this embodiment a 160 ohm resistor, is provided to protect the tap for the Doppler signal D that is conducted outside the housing from the mixer structure 3 and 4. The Doppler signal tap D is connected to the voltage regulator VS by a diode bias resistor 10 which in the present embodiment is s 51 kohm resistor.

Figure 5:
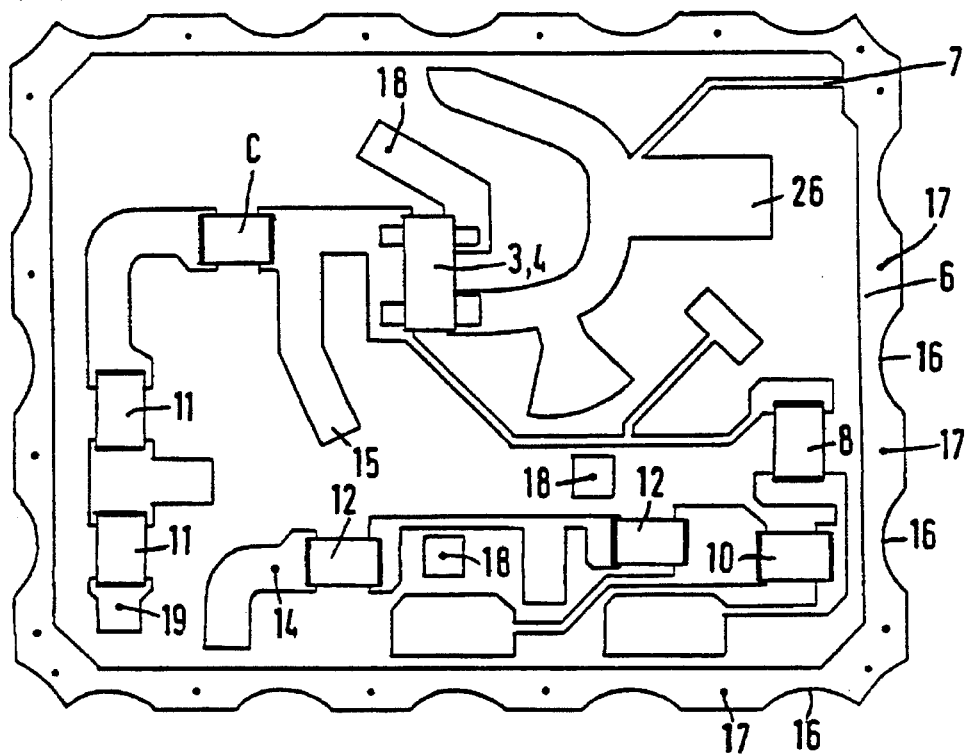
FIG. 5 is a plan view of the other side of the multi-layers motherboard of FIG. 4 of showing the circuits thereon.

In FIG. 4 and 5 are shown the plan views of the two sides of the multi-layer motherboard 6 and the circuit parts mounted thereon. The microwave multi-layer motherboard 6 is preferably of two Teflon motherboards that are copper laminated on both sides and that prior to being glued together are etched free of the copper laminate in predetermined way. Since the dielectric constant the glue does not play a critical part in this embodiment, the glue used for gluing the two circuit boards together need only be a conditionally RF-compatible glue. This is an advantage realized by the present invention. It is also advantageous that microwaves signals may be guided on both sides of the multi-layer motherboard 6.

As shown in FIG. 4, the multi-layer motherboard 6 is provided on one side with stripline of the microwave oscillator 2 (that is shown in FIG. 1) which includes a field effect transistor 22 as an active element of the local oscillator 2 along with a gate DC resistor 9 and an RF series resistor 13. Also provided on this side of the multi-layer motherboards 6 as shown in FIG. 4 is the dielectric resonator 1. The RF series resistor 13 it is optimally dimensioned to assure matching of the oscillator 2 at low impedance and to simultaneously reduced the output of the oscillator.

The other side of the multi-layer motherboard 6 is shown in FIG. 5. Located thereon is a surface wave filter structure formed of resistors 11. Also found on this side of the multi-layer motherboard 6 are transistor resistors 12, the diode mixer 3 and 4, and an antenna matching structure 26. A decoupling capacitor C is connected between the oscillator 2 and the mixer 3 and 4. The microwave signal is supplied to the mixer 3 and 4 by a microwave stub 15 and by the surface wave filter composed of the two resistors 11.

The local oscillator (LO) signal that is generated by the oscillator 2 is conducted from one side to the other side of the motherboard 6 by a through contacting connection 19. Thus, a corresponding portion of the two middle copper layers of the joined motherboards must be etched free adjacent the connection 19. The same principle utilizing through contacting connections 14 is used to provide the supply voltage to the transistor 22 via the resistors 12 from one side to the other side of multi-layer motherboard 6. Additional through contacting connections 16 and 17 (which are of an outside diameter of 3.4 mm and an inside diameter of 0.5 mm) are provided at the circumference of the multi-layer motherboard 6 to serve as an RF ground of the two middle copper layers and also to avoid RF emissions at the edges of the multi-layer motherboard 6. Through contacting connections 18 connect the field effect transistor 22 and the parallel diode 4 of the mixer to the two middle copper layers. The connection of the two middle copper layers, which are the intermediate layers of the multi-layer motherboard 6, to the housing is guaranteed by soldering the multi-layer motherboard 6 into the housing.

It is especially advantageous that the manufacture of a number of motherboards is significantly facilitated due to the position and arrangement of the through contacting connections 16 at the edges of each of every individual motherboard 6. The position of the through contacting connections 16 and the punching process that is used to produce these connections result in a perforation, or toothed, structure along the edges of the multi-layer motherboard 6 that is similar to that of a postage stamp.

The components which are mounted on the multi-layer motherboard 6 are preferably surfaced mountable components which are assembled onto the motherboard 6 by automatic equipping machine in mass production.

The stripline Doppler radar module of the present invention, thus, essentially comprises the following components:

a multi-layer motherboard with an oscillator and a mixer, a microwave antenna, and a housing of an electrically conductive material having a cover and a tuning screw, a low frequency motherboard with a voltage regulator, and a Doppler signal amplifier.

Figure 6:
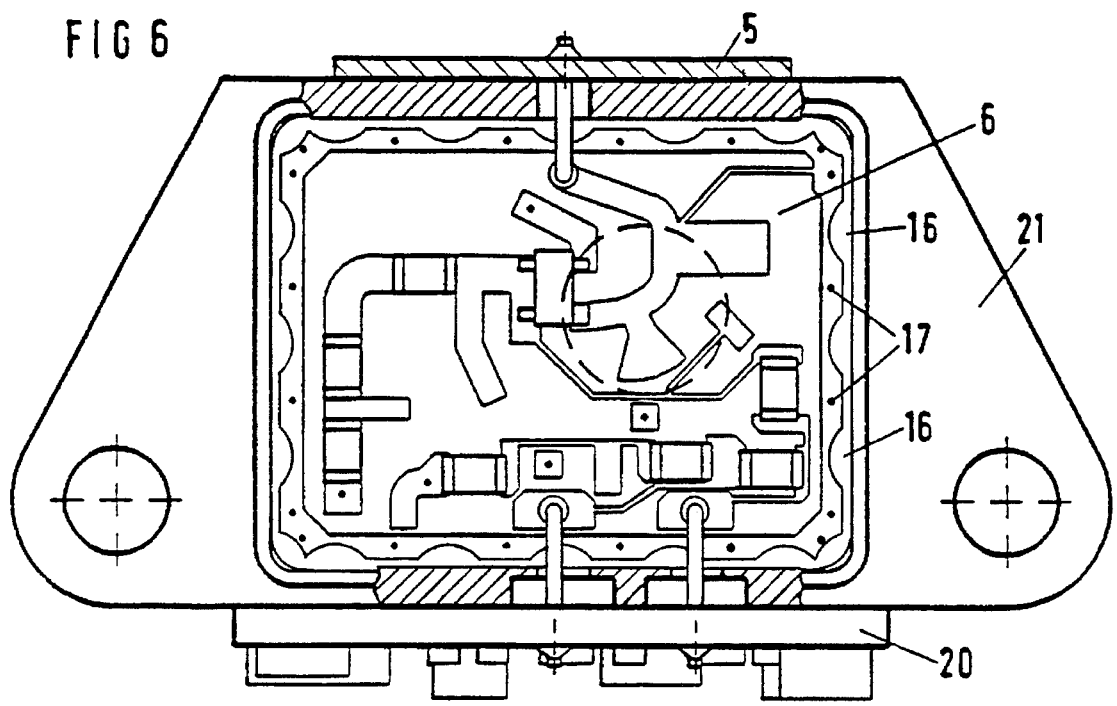
FIG. 6 is a plan view of an embodiment of a Doppler radar module with the cover removed.

In FIG. 6 and 7 is shown the Doppler radar module with the low frequency motherboard 20. The low frequency motherboard 20 includes a stabilized voltage regulator and circuitry for editing the Doppler signal. Included among these is a Doppler signal preamplifier VA (as shown in FIG. 1) which amplifies the Doppler signal at a voltage gain of approximately 1000.

After the microwave antenna 5 and the low frequency motherboard 20 have been soldered onto a housing 21, the multi-layer motherboard 6 is soldered into the housing 21 at a shoulder 5 provided for that purpose. Subsequently, three silver wire pieces 24 are introduced for connecting the multi-layer motherboard 6 to the microwave antenna 5 as well as to the DC voltage supply and to the Doppler signal lead. A housing cover 23, as shown in FIG. 7 is soldered into place on the cover 21. The soldering of all of the components guarantees a high quality standard. Finally, a tuning screw 25 is adjusted to determine the frequency of the emitted microwave signal.

The stripline Doppler radar module according to the present invention may be used, for example, as a motion sensor, as a door opener, or for other similar applications in many different areas.

Thus, there is shown and described a Doppler radar module having high sensitivity with low transmission power and low emission of harmonics, as well as high ESD resistance and a compact structure. The module includes local oscillators stabilized with a dielectric resonator that feeds a microwave antenna via a mixer connected in series. The transmission signal is emitted from the microwave antenna and is reflected back from an object and received by the antenna for supply to the mixer, where it is mixed with a portion of the oscillator signal to form a Doppler signal.

Although other modifications and changes may be suggested by those skilled in the art, it is the intention of the inventors to embody within the patent warranted hereon all changes and modifications as reasonably and properly come within the scope of their contribution to the art.

We claim:

1. A Doppler radar module for forming Doppler signals from reflections from an object, comprising:

a housing of electrically conductive material;

a dielectric resonator mounted in said housing;

a local oscillator connected to said dielectric resonator, said dielectric resonator stabilizing an oscillator signal from said local oscillator;

a mixer connected to an output of said local oscillator to receive said oscillator signal;

a mismatch circuit connected between said mixer and said local oscillator;

a microwave antenna connected in series with said mixer to receive said oscillator signal from said output of said local oscillator via said mixer so that a transmission signal is emitted from said microwave antenna, said microwave antenna receiving reflections of said transmission signal from the object and connected to transmit received signals to said mixer; and an antenna matching circuit connected between said mixer and said antenna;

wherein said mixer is connected to mix part of said oscillator signal from said local oscillator with the received signal to form a Doppler signal.

2. A Doppler radar module as claimed in claim 1, wherein said mixer includes:

first and second diodes;

said mismatch circuit being connected between said first diode and said local oscillator;

said antenna matching circuit being connected between said first diode and said antenna; and a micro-stripline connected between said second diode and ground.

3. A Doppler radar module as claimed in claim 1, further comprising:

a multi-layer motherboard mounted in said housing such that said housing is divided into two chambers, said multi-layer motherboard having a first side on which is provided said local oscillator and a second side on which is mounted said mixer;

a transistor on said first side of said multi-layer motherboard; and an antenna feed on said second side of said multi-layer motherboard;

said multi-layer motherboard being composed of two motherboards which are laminated with a copper layer at both sides and are etched free of portions of the copper layer in a predetermined way, said two motherboards being joined to one another at the back sides thereof.

4. A Doppler radar module as claimed in claim 1, further comprising:

a λ/4 stripline connected between said mixer and ground at an antenna side of said mixer; and a protective resistor connected to an output side of said mixer.

5. A Doppler radar module as claimed in claim 3, further comprising:

glue joining said two motherboards to one another.

6. A Doppler radar module as claimed in claim 1, wherein said local oscillator includes an active element that is a field effect transistor.

7. A Doppler radar module as claimed in claim 1, wherein said local oscillator includes an active element that is a bipolar transistor.

8. A Doppler radar module as claimed in claim 3, wherein said transistor on said first side is a field effect transistor for driving said local oscillator as an active element;

said dielectric resonator is on said first side;

said local oscillator includes striplines on said first side;

said antenna feed includes an antenna matching circuit; and further comprising:

a gate DC resistor and an RF series resistor connected to said field effect transistor and mounted on said first side;

a surface wave filter on said second side;

a voltage supply drop resistor on said second side; and through contacting connections from said first side to said second side to connect oscillator signals from said local oscillator from said first side to said second side.

9. A Doppler radar module as claimed in claim 1, wherein said microwave antenna is a patch antenna.

10. A Doppler radar module as claimed in claim 3, wherein said multi-layer motherboard includes a plurality of through contacting at a circumference of said motherboard to connect middle layers of said multi-layer motherboard to said housing, said middle layers being formed by the copper layer at the joined back sides of said two motherboards.

11. A Doppler radar module as claimed in claim 10, wherein said plurality of through contacting form edge perforations.

12. A Doppler radar module as claimed in claim 1, further comprising:

a low frequency motherboard connected to said housing.

* * * * *